(12) United States Patent
Senju

(10) Patent No.: US 8,476,755 B2
(45) Date of Patent: Jul. 2, 2013

(54) HIGH FREQUENCY CERAMIC PACKAGE AND FABRICATION METHOD FOR THE SAME

(75) Inventor: Tomohiro Senju, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 327 days.

(21) Appl. No.: 12/417,217

(22) Filed: Apr. 2, 2009

(65) Prior Publication Data

US 2010/0019376 A1      Jan. 28, 2010

(30) Foreign Application Priority Data

Jul. 28, 2008  (JP) ................................ 2008-193487

(51) Int. Cl.
*H01L 23/10*  (2006.01)

(52) U.S. Cl.
USPC .......................................................... 257/710

(58) Field of Classification Search
USPC ..................... 257/684, 701–704, 710
See application file for complete search history.

(56) References Cited

U.S. PATENT DOCUMENTS

| | | | | |
|---|---|---|---|---|
| 4,881,116 A * | 11/1989 | Hidada et al. | ................. | 257/700 |
| 5,465,008 A | 11/1995 | Goetz et al. | | |
| 5,602,421 A * | 2/1997 | Li | ................. | 257/728 |
| 5,692,298 A | 12/1997 | Goetz et al. | | |
| 6,271,579 B1 * | 8/2001 | Going et al. | ................. | 257/664 |
| 6,627,987 B1 * | 9/2003 | Glenn et al. | ................. | 257/704 |

FOREIGN PATENT DOCUMENTS

| | | |
|---|---|---|
| JP | 49-19354 | 5/1974 |
| JP | 52-59572 | 5/1977 |
| JP | 63-262858 | 10/1988 |
| JP | 4-26546 | 3/1992 |
| JP | 10-093012 | 4/1998 |
| JP | 10-144818 | 5/1998 |
| JP | 10-189825 | 7/1998 |
| JP | 11-163180 | 6/1999 |
| JP | 11-265970 | 9/1999 |
| JP | 2000-510287 | 8/2000 |
| JP | 2002-184890 | 6/2002 |
| JP | 2004-193216 | 7/2004 |
| JP | 2005-101328 | 4/2005 |
| JP | 2005-159251 | 6/2005 |

OTHER PUBLICATIONS

Office Action Issued Jan. 8, 2013 in Japanese Application No. 2010-219327 (w/English translation).

* cited by examiner

*Primary Examiner* — Jenny L Wagner
(74) *Attorney, Agent, or Firm* — Oblon, Spivak, McClelland, Maier & Neustadt, L.L.P.

(57) ABSTRACT

A high frequency ceramic package includes: a first conductive pattern placed on the top surface of a ceramic RF substrate; a second conductive pattern placed on the bottom surface of the ceramic RF substrate; a through hole for passing through the top surface and bottom surface of the ceramic RF substrate; a through hole metal layer which is filled up in the through hole and which connects the first conductive pattern and the second conductive pattern; a ceramic seal ring placed on the ceramic RF substrate; an insulating adhesive bond placed on the ceramic seal ring; and a ceramic cap placed on the insulating adhesive bond, wherein the second conductive pattern is used as an external terminal, and between the ceramic cap and the top surfaces of the ceramic seal ring is sealed with the insulating adhesive bond and it is simple for structure and excellent in high frequency characteristics.

16 Claims, 18 Drawing Sheets

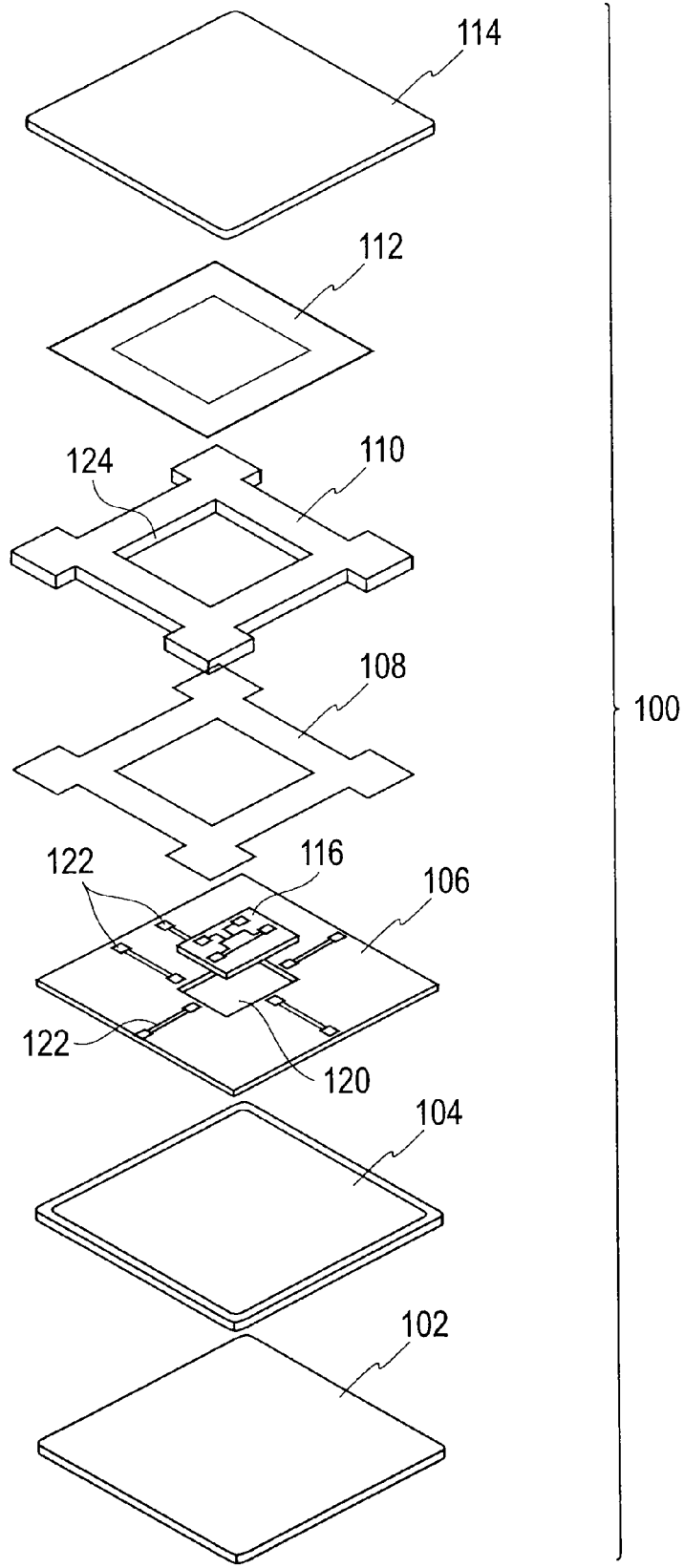

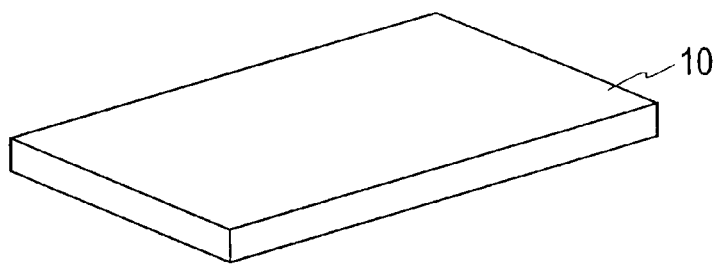
FIG. 2A
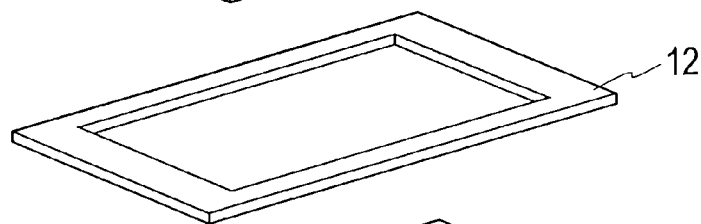
FIG. 2B
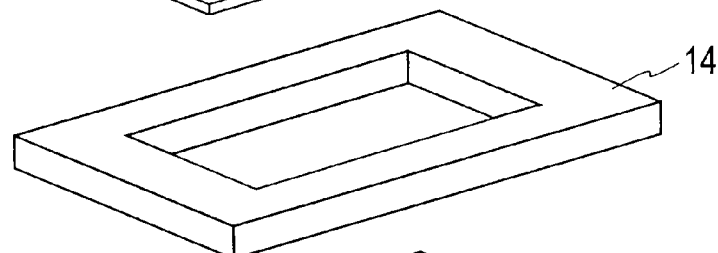
FIG. 2C
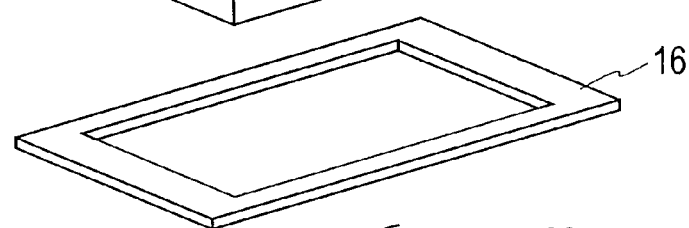
FIG. 2D
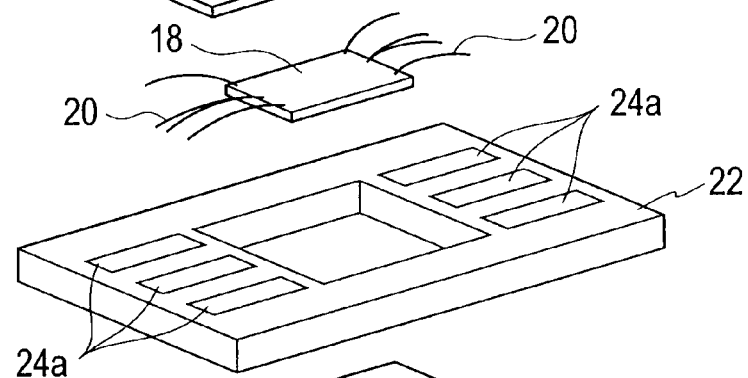
FIG. 2E
FIG. 2F
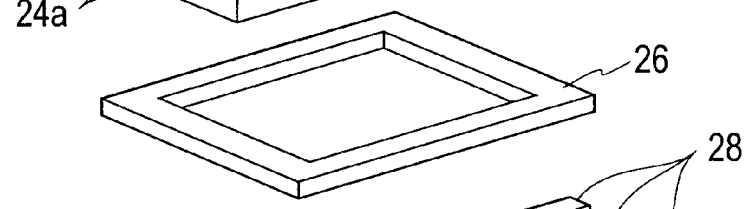
FIG. 2G
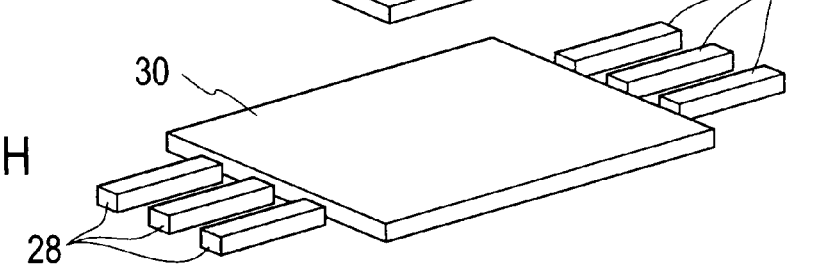
FIG. 2H

HIGH FREQUENCY CERAMIC PACKAGE AND FABRICATION METHOD FOR THE SAME

CROSS REFERENCE TO RELATED APPLICATIONS AND INCORPORATION BY REFERENCE

This application is based upon and claims the benefit of priority from prior Japanese Patent Applications No. P2008-193487 filed on Jul. 28, 2008, the entire contents of which are incorporated herein by reference.

TECHNICAL FIELD

The present invention relates to a high frequency ceramic package and a fabrication method for the same. More particularly, the present invention relates to a high frequency ceramic package, which is simple for structure and excellent in high frequency characteristics, and a fabrication method for the same.

BACKGROUND ART

The semiconductor device used with a high frequency band, for example, a microwave power amplifying device, is composed of passive elements, such as a field effect transistor, and active elements, such as a resistance, and a capacitor, and circuit elements, such as a micro-strip line for transmitting a high frequency signal. Such a microwave power amplifying device is mounted in a package 100 as shown in FIG. 1, for example (for example, refer to the Patent Literature 1 and Patent Literature 2).

That is, as shown in FIG. 1, a conventional package 100 includes: a base 102; a ceramic RF substrate 106 having a first cavity area 120 and conductive patterns 122; attaching means 104 for attaching an RF substrate 106 to the top surface of the base 102; a ceramic seal ring substrate 110 having a second cavity area 124 larger than the first cavity area 120; and second attaching means 108 for attaching the ceramic seal ring substrate 110 to the RF substrate 106. This second attaching means 108 is adjusted with the size of the seal ring 110. The package 100 further includes a ceramic lid 114 attached to the ceramic seal ring substrate 110 by non-conducting third attachment means 112. As shown in FIG. 1, a micro electron device and other electric components 116 are housed in such the package 100.

CITATION LIST

Patent Literature 1: U.S. Pat. No. 5,692,298
Patent Literature 2: Published Japanese translation of a PCT application No. 2000-510287

SUMMARY OF THE INVENTION

Technical Problem

Since the external terminal is formed in the top surface of the ceramic RF substrate 106 with the conductive patterns 122 in the conventional package 100, the surface mount by a reflow is difficult.

The purpose of the invention is to provide a high frequency ceramic package, which the structure is easy, and the fabrication method is easy for, and is excellent in high frequency characteristics, and a fabrication method for the high frequency ceramic package.

The purpose of the invention is to provide a high frequency ceramic package in which the surface mount by a reflow is possible, and a fabrication method for the high frequency ceramic package.

The purpose of the invention is to provide a high frequency ceramic package where the impedance mismatching between an external terminal and the conductive patterns on a package mounting substrate is reduced and which is excellent in RF characteristics in particular high frequency, such as a millimeter wave, and a fabrication method for the high frequency ceramic package

Solution to Problem

According to an aspect of the invention, a high frequency ceramic package comprises a ceramic RF substrate; a first conductive pattern placed on the top surface of the ceramic RF substrate; a second conductive pattern placed on the bottom surface of the ceramic RF substrate; a through hole for passing through the top surface and bottom surface of the ceramic RF substrate; a through hole metal layer which is filled up in the through hole and which connects the first conductive pattern and the second conductive pattern; a ceramic seal ring placed on the ceramic RF substrate; an insulating adhesive bond placed on the ceramic seal ring; and a ceramic cap placed on the insulating adhesive bond, wherein the second conductive pattern is used as an external terminal, and between the ceramic cap and the top surfaces of the ceramic seal ring is sealed with the insulating adhesive bond.

According to another aspect of the invention, a high frequency ceramic package comprises a ceramic RF substrate; a first conductive pattern placed on the top surface of the ceramic RF substrate; a through hole for passing through the top surface and bottom surface of the ceramic RF substrate; a through hole metal layer which is filled up in the through hole and is connected with the first conductive pattern; a ceramic seal ring placed on the ceramic RF substrate; an insulating adhesive bond placed on the ceramic seal ring; and a ceramic cap placed on the insulating adhesive bond, wherein between the ceramic cap and the top surfaces of the ceramic seal ring is sealed with the insulating adhesive bond.

According to another aspect of the invention, a fabrication method for a high frequency ceramic package comprises forming a ceramic RF substrate; forming a first conductive pattern on the top surface of the ceramic RF substrate; forming a second conductive pattern on the bottom surface of the ceramic RF substrate; forming a through hole for passing through the top surface and bottom surface of the ceramic RF substrate; forming a through hole metal layer which is filled up in the through hole and connects the first conductive pattern and the second conductive pattern; forming a ceramic seal ring on the ceramic RF substrate; forming an insulating adhesive bond on the ceramic seal ring; and forming a ceramic cap on the insulating adhesive bond.

According to another aspect of the invention, a fabrication method for a high frequency ceramic package comprises forming a ceramic RF substrate; forming a first conductive pattern on the top surface of the ceramic RF substrate; forming a through hole for passing through the top surface and bottom surface of the ceramic RF substrate; forming a through hole metal layer which is filled up in the through hole and connected with the first conductive pattern; forming a ceramic seal ring on the ceramic RF substrate; forming an insulating adhesive bond on the ceramic seal ring; and forming a ceramic cap on the insulating adhesive bond.

Advantageous Effects of Invention

According to the present invention, a high frequency ceramic package, which the structure is easy, and the fabrication method is easy for, and is excellent in high frequency characteristics, and a fabrication method for the high frequency ceramic package can be provided.

According to the present invention, by providing the external terminal in the bottom surface of the ceramic RF substrate, the external terminal can be formed on the same plane of the bottom surface of the package, and then a high frequency ceramic package in which the surface mount by a reflow is possible, and a fabrication method for the high frequency ceramic package can be provided.

According to the present invention, by providing the external terminal in the bottom surface of the ceramic RF substrate, a high frequency ceramic package in which the impedance mismatching between the external terminal and the conductive pattern on the package mounting substrate is reduced, and the improvement effect of RF characteristics appears remarkably in particular in high frequency, such as a millimeter wave, and a fabrication method for the high frequency ceramic package can be provided.

BRIEF DESCRIPTION OF DRAWINGS

FIG. 1 is a schematic bird's-eye view explaining a conventional package and a fabrication method for the conventional package.

FIG. 2A is a schematic bird's-eye view explaining a high frequency ceramic package according to a first embodiment of the present invention, and a fabrication method for the high frequency ceramic package, and is a schematic configuration diagram of a ceramic cap 10.

FIG. 2B is a schematic bird's-eye view explaining the high frequency ceramic package according to the first embodiment of the present invention, and a fabrication method for the high frequency ceramic package, and is a schematic configuration diagram of an insulating adhesive bond 12.

FIG. 2C is a schematic bird's-eye view explaining the high frequency ceramic package according to the first embodiment of the present invention, and a fabrication method for the high frequency ceramic package, and is a schematic configuration diagram of a ceramic seal ring 14.

FIG. 2D is a schematic bird's-eye view explaining the high frequency ceramic package according to the first embodiment of the present invention, and a fabrication method for the high frequency ceramic package, and is a schematic configuration diagram of an insulating adhesive bond 16.

FIG. 2E is a schematic bird's-eye view explaining the high frequency ceramic package according to the first embodiment of the present invention, and a fabrication method for the high frequency ceramic package, and is a schematic configuration diagram of a semiconductor chip 18.

FIG. 2F is a schematic bird's-eye view explaining the high frequency ceramic package according to the first embodiment of the present invention, and a fabrication method for the high frequency ceramic package, and is a schematic configuration diagram of a ceramic RF substrate 22.

FIG. 2G is a schematic bird's-eye view explaining the high frequency ceramic package according to the first embodiment of the present invention, and a fabrication method for the high frequency ceramic package, and is a schematic configuration diagram of insulating or conductive adhesive bond 26.

FIG. 2H is a schematic bird's-eye view explaining the high frequency ceramic package according to the first embodiment of the present invention, and a fabrication method for the high frequency ceramic package, and is a schematic configuration diagram of a conductive base plate 30.

DESCRIPTION OF EMBODIMENTS

Figure 3A:
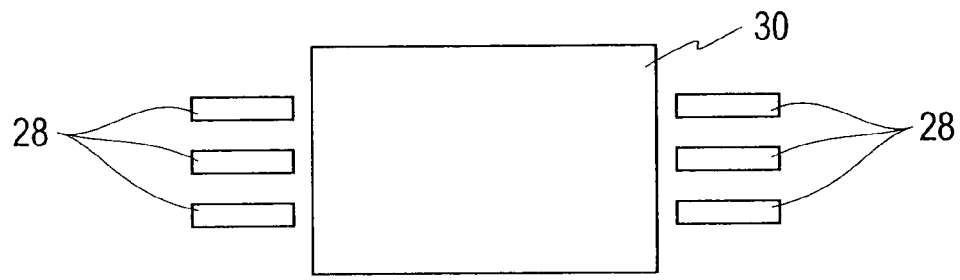
FIG. 3A is a configuration diagram of a conductive base plate 30 and a conductive lead 28 of the high frequency ceramic package according to the first embodiment of the present invention, and shows its top view.

There will be described embodiments of the present invention, with reference to the drawings, where like members or elements are designated by like reference characters to eliminate redundancy, and some package component layers and their subsidiary regions are designated by the same reference characters for simplicity. Drawings are schematic, not actual, and may be inconsistent in between in scale, ratio, etc.

The embodiments to be described are embodiments of a technical concept or spirit of the present invention that is not limited to embodied specifics, and may be changed without departing from the spirit or scope of claims.

First Embodiment

As shown in FIG. 2, a high frequency ceramic package according to a first embodiment of the present invention includes: a ceramic cap 10; an insulating adhesive bond 12; a ceramic seal ring 14; an insulating adhesive bond 16; a semiconductor chip 18; a ceramic RF substrate 22; an insulating or conductive adhesive bond 26; and a conductive base plate 30.

(Conductive Base Plate 30 and Conductive Lead 28)

Figure 3B:
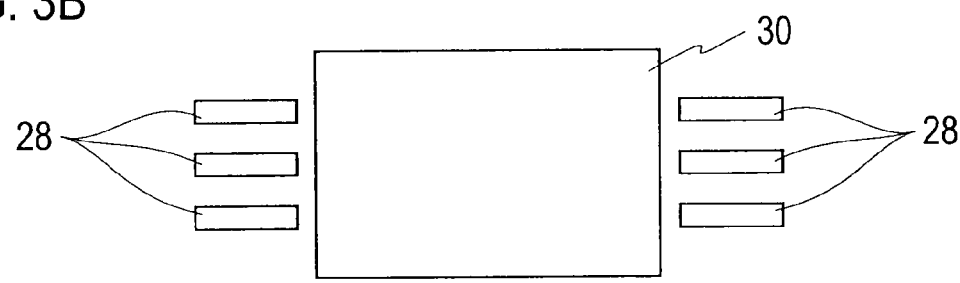
FIG. 3B is a configuration diagram of the conductive base plate 30 and the conductive lead 28 of the high frequency ceramic package according to the first embodiment of the present invention, and shows its bottom view.
Figure 3C:
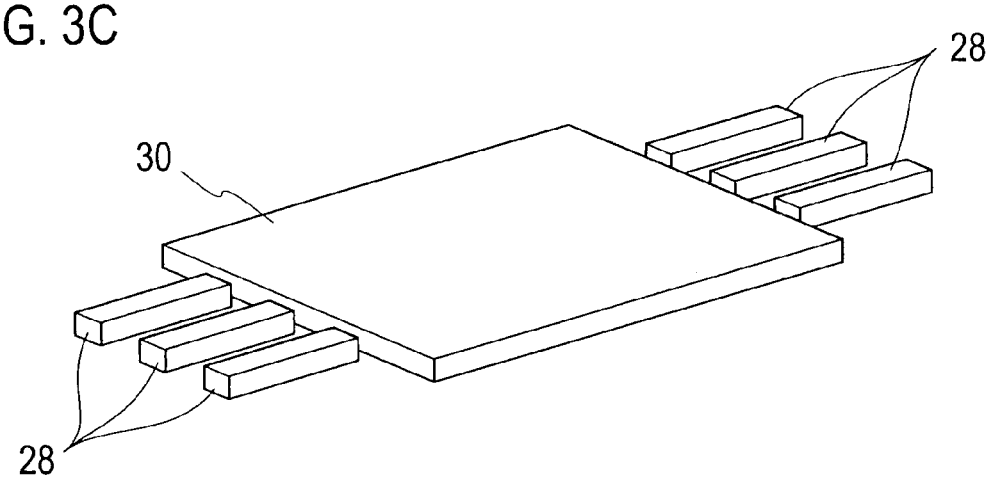
FIG. 3C is a configuration diagram of the conductive base plate 30 and the conductive lead 28 of the high frequency ceramic package according to the first embodiment of the present invention, and shows its bird's-eye view.

A configuration of the conductive base plate 30 and conductive leads of the high frequency ceramic package according to the first embodiment is expressed as shown in FIG. 3A to FIG. 3C.

The conductive base plate 30 is formed with conductive metals, such as Kovar®, copper, a copper tungsten alloy, a copper molybdenum alloy, and molybdenum, for example. Furthermore, electroplated conductors, such as a nickel, silver, and silver-platinum alloy, a silver-palladium alloy, and gold, may be formed on the surface of the conductive base plate 30, for example.

The conductive leads 28 can be made from conductive metals, such as Kovar®, copper, a copper tungsten alloy, a copper molybdenum alloy, and molybdenum, as well as the conductive base plate 30. Furthermore, electroplated conductors, such as a nickel, silver, silver-platinum alloy, a silver-palladium alloy, and gold, may be formed on the surface of the conductive leads 28, for example.

(Insulating or Conductive Adhesive Bond 26)

Figure 4A:
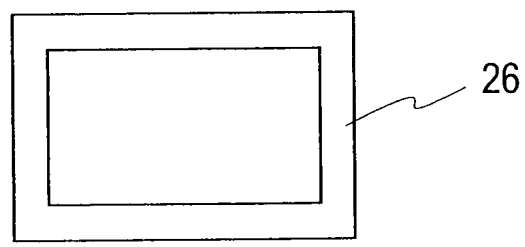
FIG. 4A is a configuration diagram of the insulating or conductive adhesive bond 26 of the high frequency ceramic package according to the first embodiment of the present invention, and shows its top view.
Figure 4B:
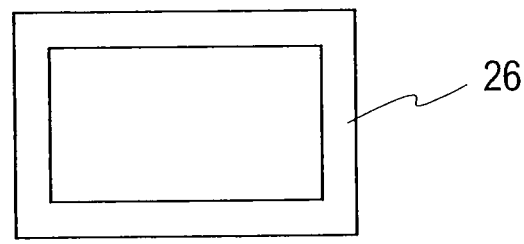
FIG. 4B is a configuration diagram of the insulating or conductive adhesive bond 26 of the high frequency ceramic package according to the first embodiment of the present invention, and shows its bottom view.
Figure 4C:
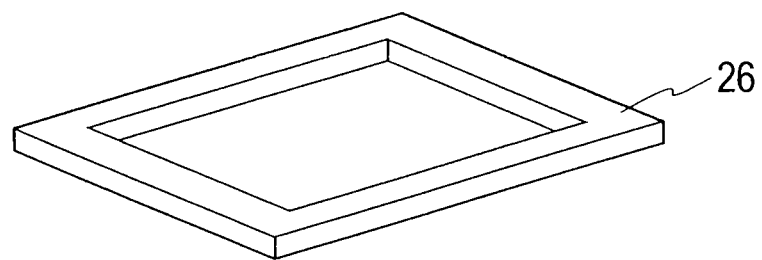
FIG. 4C is a configuration diagram of the insulating or conductive adhesive bond 26 of the high frequency ceramic package according to the first embodiment of the present invention, and shows its bird's-eye view.

A configuration of the insulation or conductive adhesive bond 26 of the high frequency ceramic package according to the first embodiment is expressed as shown in FIG. 4A to FIG. 4C. The insulating or conductive adhesive bond 26 can be formed from an epoxy resin, glass, etc. as the insulating adhesive bond, and can be formed from a golden germanium alloy, a gold tin alloy, etc. as the conductive adhesive bond, for example.

(Ceramic RF Substrate 22)

Figure 5A:
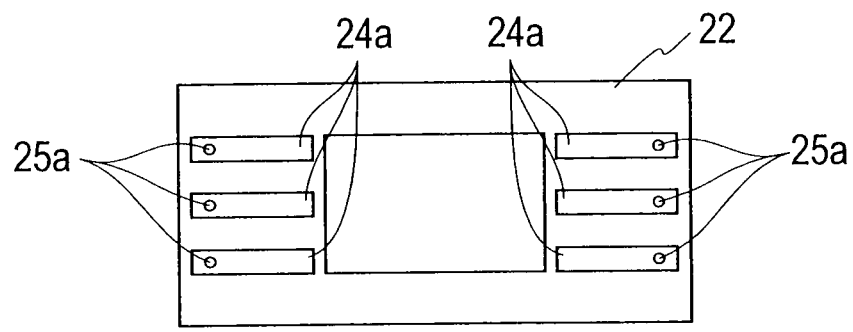
FIG. 5A is a configuration diagram of the ceramic RF substrate 22 of the high frequency ceramic package according to the first embodiment of the present invention, and shows its top view.
Figure 5B:
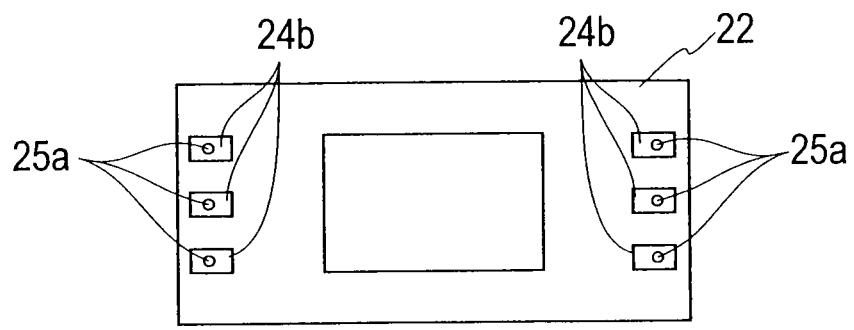
FIG. 5B is a configuration diagram of the ceramic RF substrate 22 of the high frequency ceramic package according to the first embodiment of the present invention, and shows its bottom view.
Figure 5C:
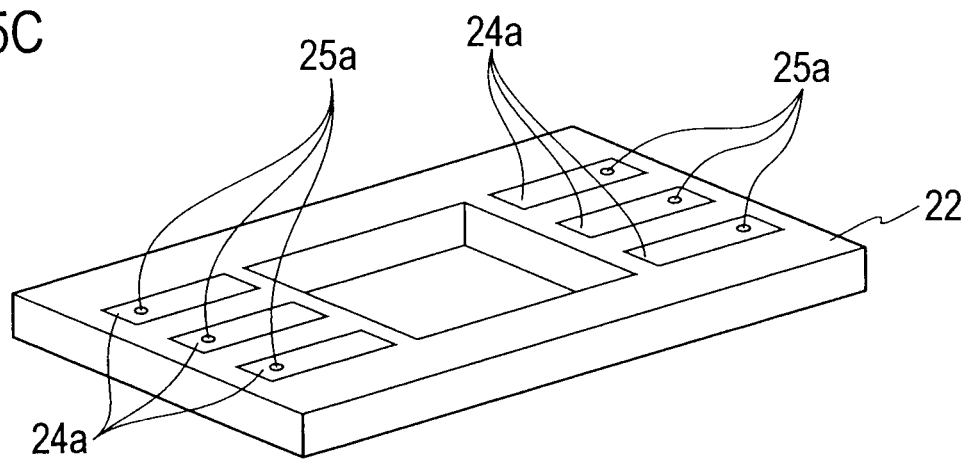
FIG. 5C is a configuration diagram of the ceramic RF substrate 22 of the high frequency ceramic package according to the first embodiment of the present invention, and shows its bird's-eye view.

A configuration of the ceramic RF substrate 22 is expressed as shown in FIG. 5A to FIG. 5C. As material of the ceramic RF substrate 22, it can form from alumina ($Al_2O_3$), aluminum nitride (AlN), beryllium oxide (BeO), etc., for example.

As shown in FIG. 5A, first conductive patterns 24a are placed on the top surface of the ceramic RF substrate 22. As shown in FIG. 5B, second conductive patterns 24b are placed on the bottom surface of the ceramic RF substrate 22. The first conductive patterns 24a and the second conductive patterns 24b can be formed by screen-printing etc.

Furthermore, as shown in FIG. 5A to FIG. 5C, through holes 25a for passing through the top surface and the bottom surface of the ceramic RF substrate 22 are formed. In addition, as shown in FIG. 14 described later, the through hole metal layers 25 for electrically connecting the first conductive patterns 24a and the second conductive patterns 24b are filled up in the through holes 25a.

Figure 6A:
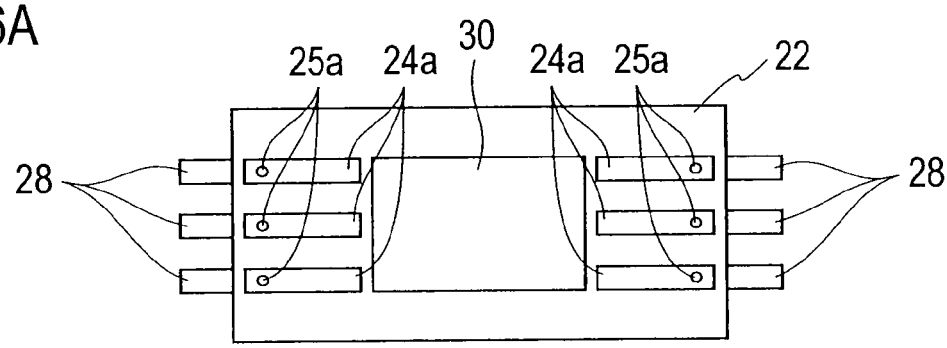
FIG. 6A is a configuration diagram showing an aspect that the conductive base plate 30 and the ceramic RF substrate 22 of the high frequency ceramic package according to the first embodiment of the present invention are bonded, and shows its top view.
Figure 6B:
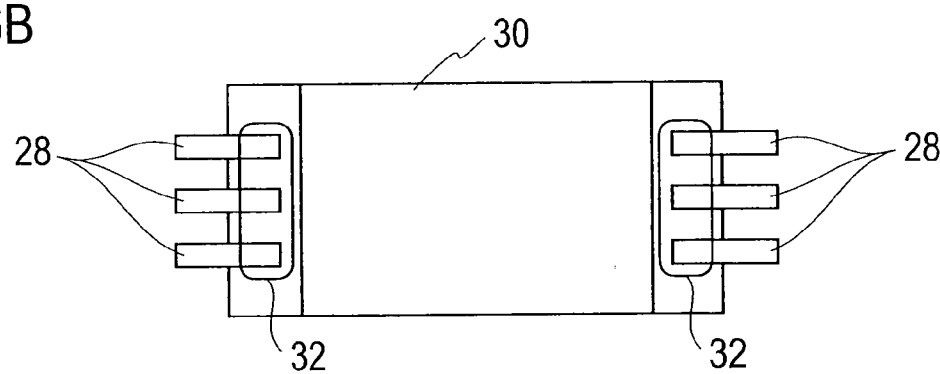
FIG. 6B is a configuration diagram showing an aspect that the conductive base plate 30 and the ceramic RF substrate 22 of the high frequency ceramic package according to the first embodiment of the present invention are bonded, and shows its bottom view.
Figure 6C:
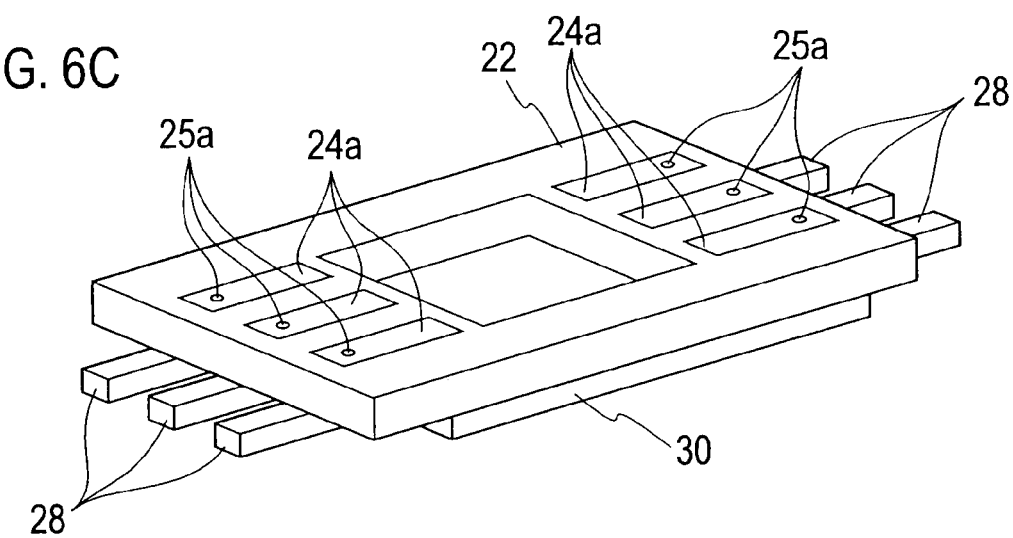
FIG. 6C is a configuration diagram showing an aspect that the conductive base plate 30 and the ceramic RF substrate 22 of the high frequency ceramic package according to the first embodiment of the present invention are bonded, and shows its bird's-eye view.

In the high frequency ceramic package according to the first embodiment, the configuration which the conductive base plate 30, the conductive leads 28, and ceramic RF substrate 22 are bonded is expressed, as shown in FIG. 6A to FIG. 6C. The high frequency ceramic package according to the first embodiment includes a brazing portion 32 for connecting the conductive leads 28 and the second conductive patterns 24b, as shown in FIG. 6B.

Moreover, in the high frequency ceramic package according to the first embodiment, the ceramic RF substrate 22 is placed on the conductive base plate 30 via the insulating or conductive adhesive bond 26.

(Insulating Adhesive Bond 16)

Figure 7A:
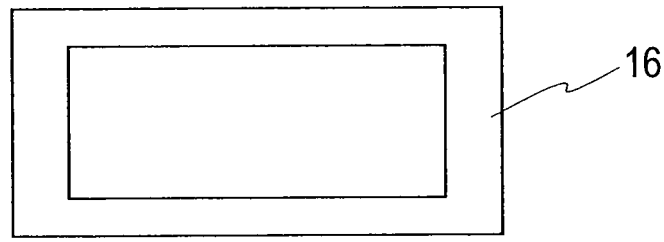
FIG. 7A is a configuration diagram of the insulating adhesive bond 16 of the high frequency ceramic package according to the first embodiment of the present invention, and shows its top view.
Figure 7B:
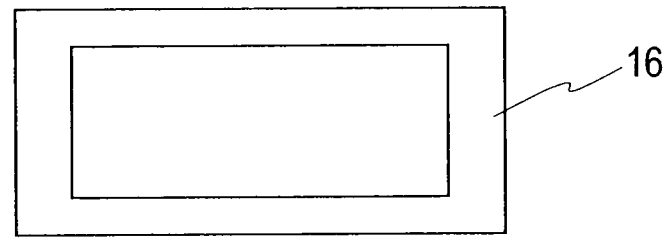
FIG. 7B is a configuration diagram of the insulating adhesive bond 16 of the high frequency ceramic package according to the first embodiment of the present invention, and shows its bottom view.
Figure 7C:
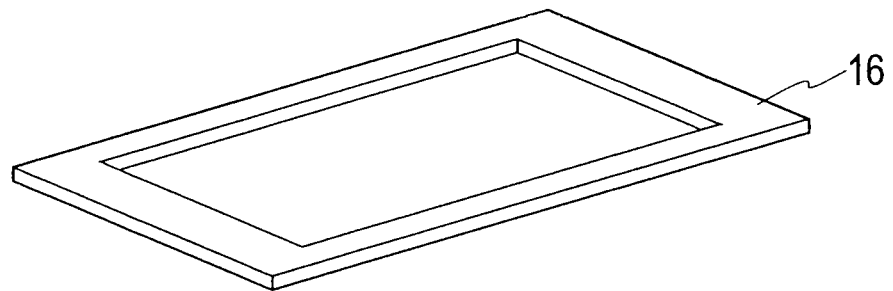
FIG. 7C is a configuration diagram of the insulating adhesive bond 16 of the high frequency ceramic package according to the first embodiment of the present invention, and shows its bird's-eye view.

A configuration of the insulating adhesive bond 16 is expressed as shown in FIG. 7. As material of the insulating adhesive bond 16, it can form with an epoxy resin, glass, etc., for example.

(Ceramic Seal Ring 14)

Figure 8A:
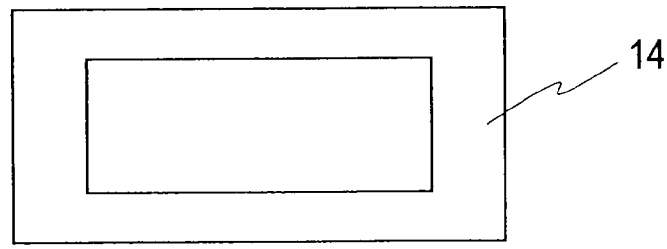
FIG. 8A is a configuration diagram of the ceramic seal ring 14 of the high frequency ceramic package according to the first embodiment of the present invention, and shows its top view.
Figure 8B:
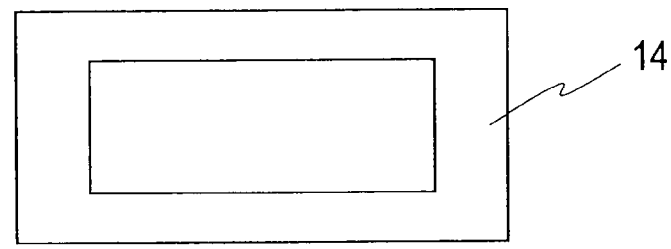
FIG. 8B is a configuration diagram of the ceramic seal ring 14 of the high frequency ceramic package according to the first embodiment of the present invention, and shows its bottom view.
Figure 8C:
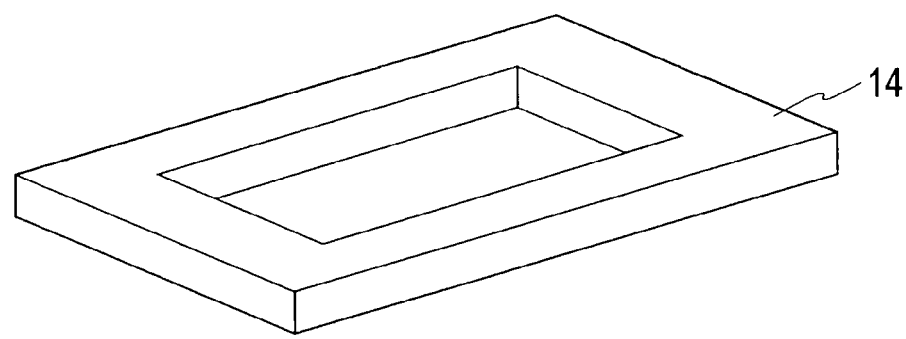
FIG. 8C is a configuration diagram of the ceramic seal ring 14 of the high frequency ceramic package according to the first embodiment of the present invention, and shows its bird's-eye view.

A configuration of the ceramic seal ring 14 is expressed as shown in FIG. 8. As material of the ceramic seal ring, it can form from alumina, aluminum nitride, beryllium oxide, etc., for example.

Figure 9A:
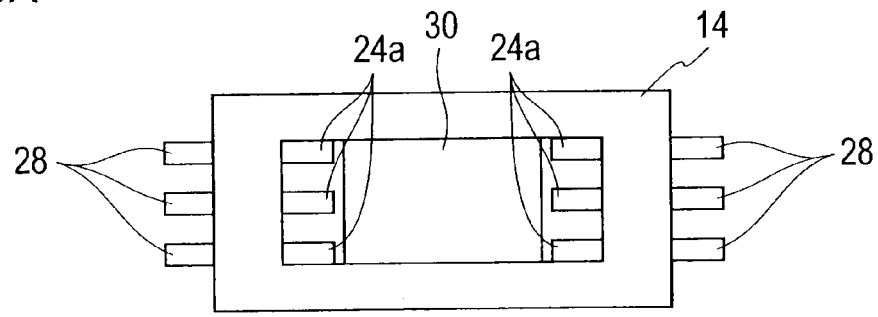
FIG. 9A is a configuration diagram showing an aspect of bonding of the ceramic seal ring 14 of the high frequency ceramic package according to the first embodiment of the present invention, and shows its top view.
Figure 9B:
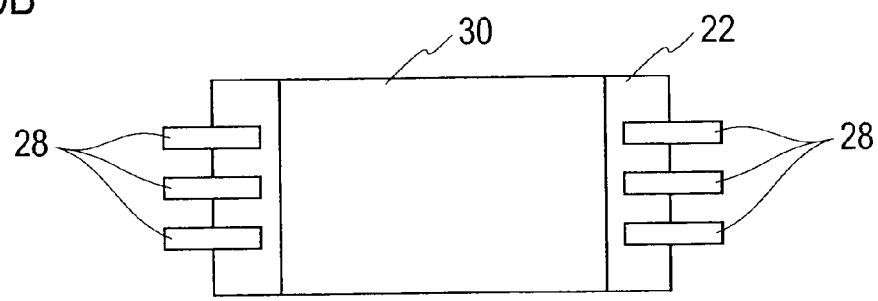
FIG. 9B is a configuration diagram showing an aspect of bonding of the ceramic seal ring 14 of the high frequency ceramic package according to the first embodiment of the present invention, and shows its bottom view.
Figure 9C:
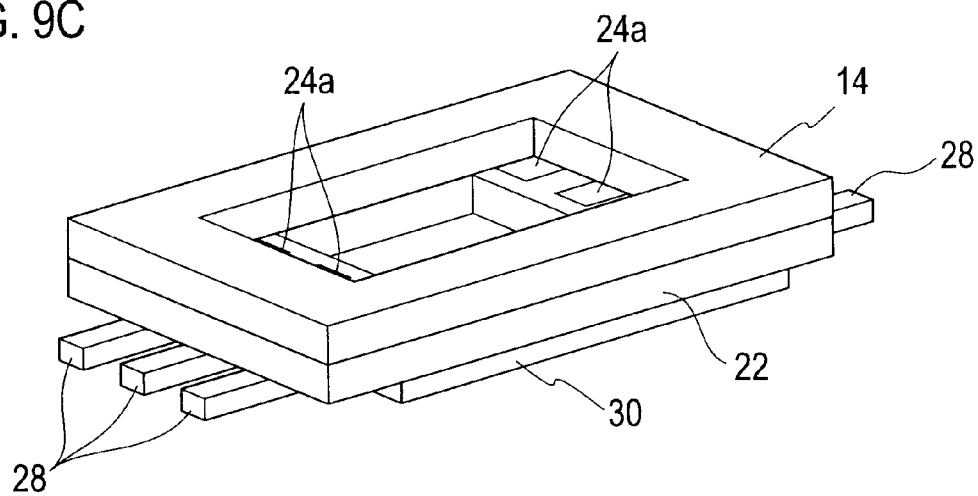
FIG. 9C is a configuration diagram showing an aspect of bonding of the ceramic seal ring 14 of the high frequency ceramic package according to the first embodiment of the present invention, and shows its bird's-eye view.

In the high frequency ceramic package according to the first embodiment, a configuration diagram showing an aspect of bonding of the ceramic seal ring 14 is expressed, as shown in FIG. 9A to FIG. 9C.

Figure 10A:
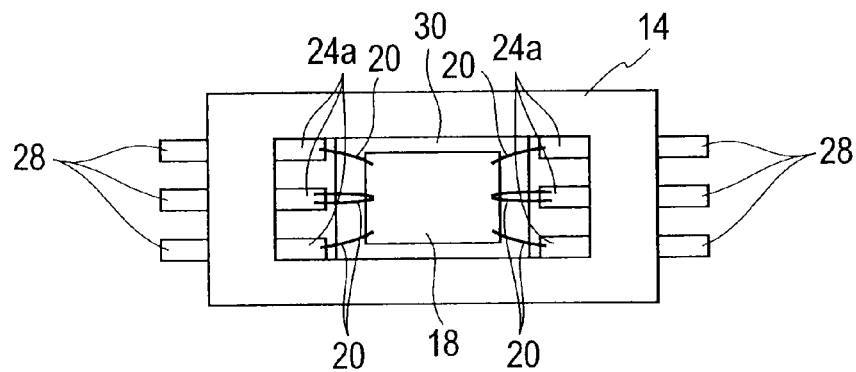
FIG. 10A is a configuration diagram showing a mounting state of the semiconductor chip 18 of the high frequency ceramic package according to the first embodiment of the present invention, and shows its top view.
Figure 10B:
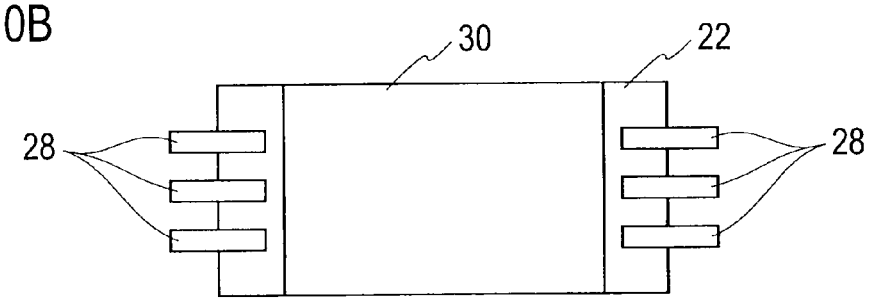
FIG. 10B is a configuration diagram showing a mounting state of the semiconductor chip 18 of the high frequency ceramic package according to the first embodiment of the present invention, and shows its bottom view.
Figure 10C:
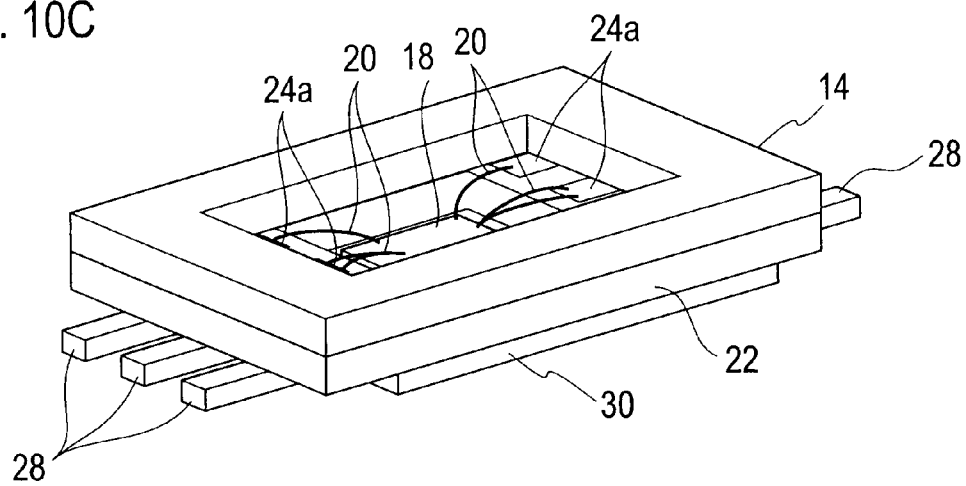
FIG. 10C is a configuration diagram showing a mounting state of the semiconductor chip 18 of the high frequency ceramic package according to the first embodiment of the present invention, and shows its bird's-eye view.

In the high frequency ceramic package according to the first embodiment, a configuration showing a mounting state of the semiconductor chip 18 is expressed, as shown in FIG. 10A to FIG. 10C. The semiconductor chip 18 is connected with the first conductive patterns 24a via the bonding wire 20, as shown in FIG. 10A to FIG. 10C.

(Insulating Adhesive Bond 12)

Figure 11A:
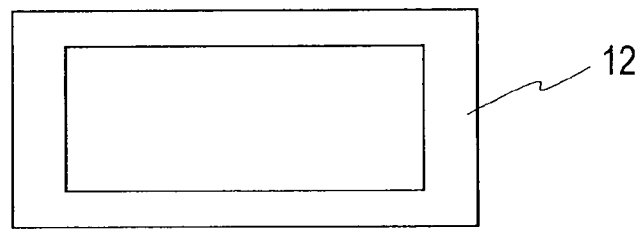
FIG. 11A is a configuration diagram of the insulating adhesive bond 12 of the high frequency ceramic package according to the first embodiment of the present invention, and shows its top view.
Figure 11B:
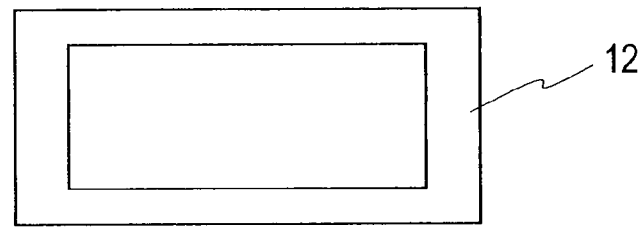
FIG. 11B is a configuration diagram of the insulating adhesive bond 12 of the high frequency ceramic package according to the first embodiment of the present invention, and shows its bottom view.
Figure 11C:
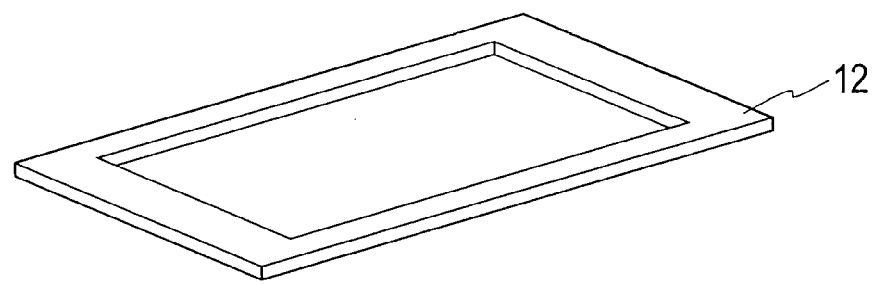
FIG. 11C is a configuration diagram of the insulating adhesive bond 12 of the high frequency ceramic package according to the first embodiment of the present invention, and shows its bird's-eye view.

A configuration of the insulating adhesive bond 12 is expressed as shown in FIG. 11. As material of the insulating adhesive bond 12, it can form with an epoxy resin, glass, etc., for example.

(Ceramic Cap 10)

Figure 12A:
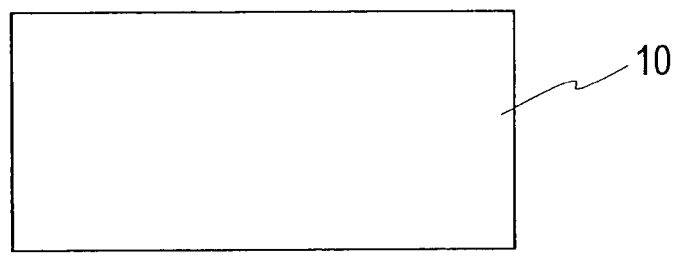
FIG. 12A is a configuration diagram of the ceramic cap 10 of the high frequency ceramic package according to the first embodiment of the present invention, and shows its top view.
Figure 12B:
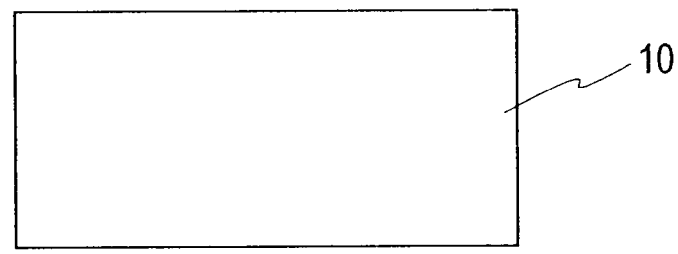
FIG. 12B is a configuration diagram of the ceramic cap 10 of the high frequency ceramic package according to the first embodiment of the present invention, and shows its bottom view.
Figure 12C:
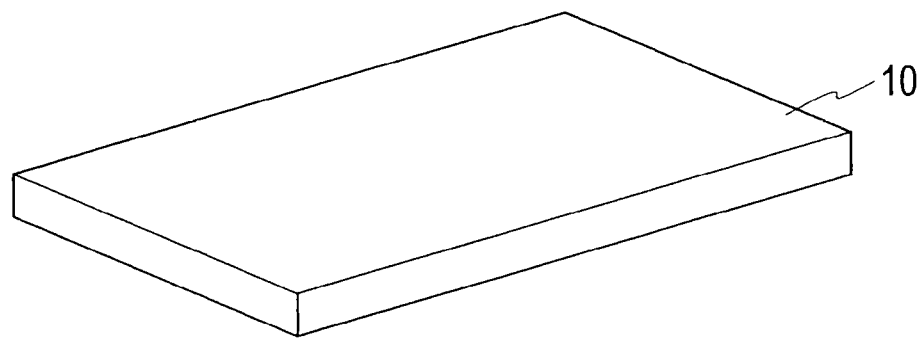
FIG. 12C is a configuration diagram of the ceramic cap 10 of the high frequency ceramic package according to the first embodiment of the present invention, and shows its bird's-eye view.

A configuration of the ceramic cap 10 of the high frequency ceramic package according to the first embodiment is expressed as shown in FIG. 12. The ceramic cap 10 has a flat plate shape as shown in FIG. 12.

Figure 13A:
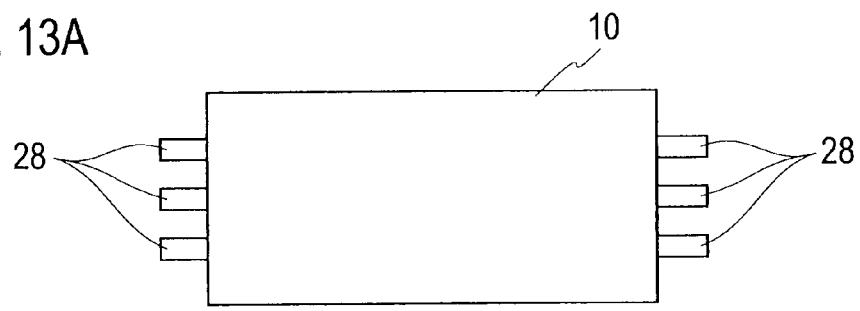
FIG. 13A is a configuration diagram showing an aspect of bonding of the ceramic cap 10 in the high frequency ceramic package according to the first embodiment of the present invention, and shows its top view.
Figure 13B:
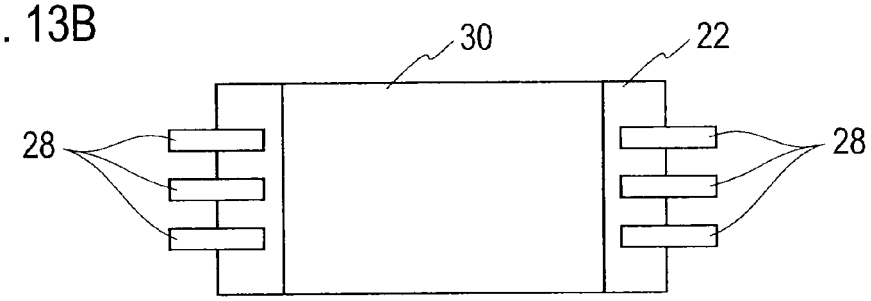
FIG. 13B is a configuration diagram showing an aspect of bonding of the ceramic cap 10 in the high frequency ceramic package according to the first embodiment of the present invention, and shows its bottom view.
Figure 13C:
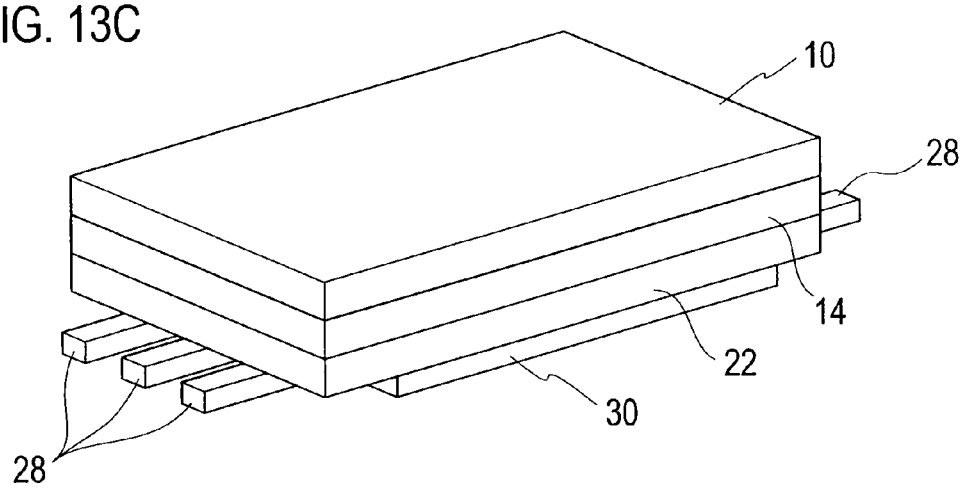
FIG. 13C is a configuration diagram showing an aspect of bonding of the ceramic cap 10 in the high frequency ceramic package according to the first embodiment of the present invention, and shows its bird's-eye view.

In the high frequency ceramic package according to the first embodiment, a configuration diagram showing an aspect of bonding of the ceramic cap 10 is expressed, as shown in FIG. 13A to FIG. 13C.

Figure 14A:
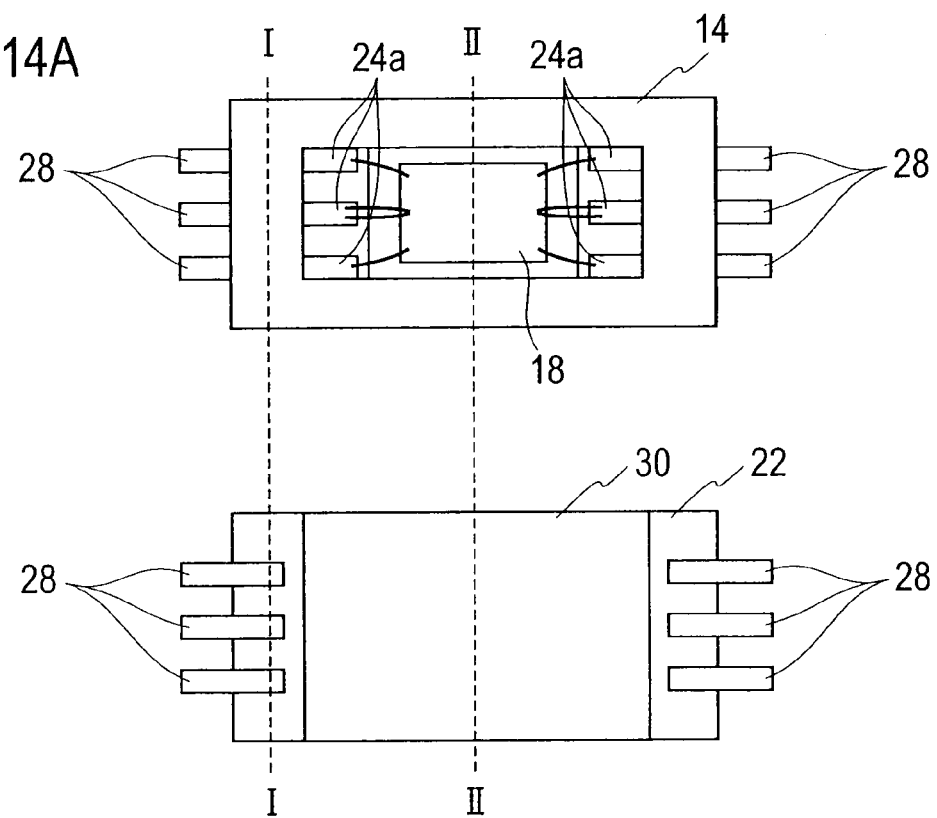
FIG. 14A is a detailed configuration diagram showing the insulating adhesive bond 12 and the state where the ceramic cap 10 is removed, in the high frequency ceramic package according to the first embodiment of the present invention, and the upper part shows a top view and the lower part shows a bottom view.
Figure 14B:
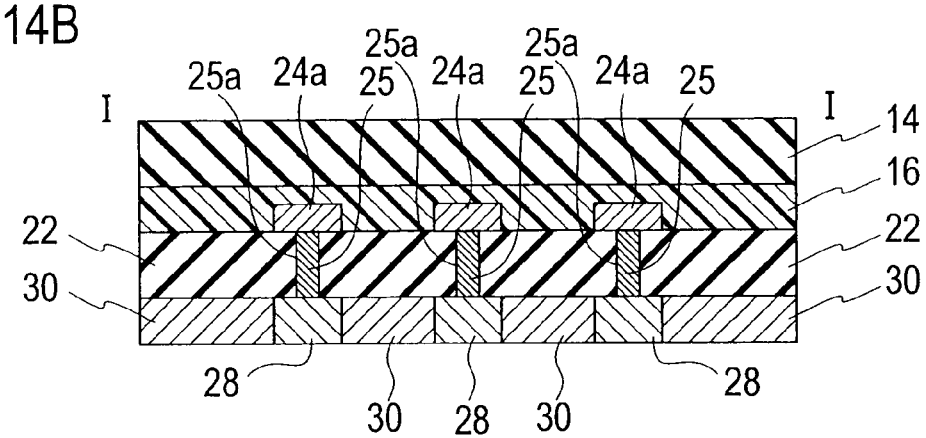
FIG. 14B is a detailed configuration diagram showing the insulating adhesive bond 12 and the state where the ceramic cap 10 is removed, in the high frequency ceramic package according to the first embodiment of the present invention, and shows a schematic cross-sectional configuration chart taken in the line I-I of FIG. 14A.
Figure 14C:
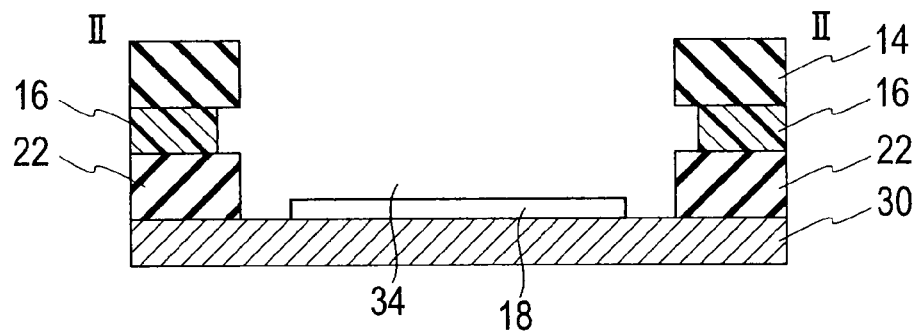
FIG. 14C is a detailed configuration diagram showing the insulating adhesive bond 12 and the state where the ceramic cap 10 is removed, in the high frequency ceramic package according to the first embodiment of the present invention, and shows a schematic cross-sectional configuration chart taken in the line II-II of FIG. 14A.

Moreover, a detailed configuration diagram showing the insulating adhesive bond 12 and the state where the ceramic cap 10 is removed are expressed as shown in FIG. 14A to FIG. 14C. As shown in FIG. 14B, the through holes 25a for passing through the top surface and the bottom surface of the ceramic RF substrate 22 are formed, and the through hole metal layers 25 for electrically connecting the first conductive patterns 24a and the second conductive patterns 24b, that omitted illustration, are filled up in the through holes 25a. The first conductive patterns 24a is electrically connected with the conductive leads 28 via the through hole metal layers 25 as a result.

The cavity portion 34 is formed by the ceramic RF substrate 22, the insulating adhesive bond 16, the ceramic seal ring 14, the insulating adhesive bond 12, and the ceramic cap 10, by placing the ceramic cap 10 via the insulating adhesive bond 12 on the ceramic seal ring 14. The semiconductor chip 18 is placed on the conductive base plate 30 in the cavity portion 34.

In the high frequency ceramic package according to the first embodiment, the second conductive patterns 24b are used as an external terminal, and between the ceramic cap 10 and the top surface of the ceramic seal ring 14 is sealed with the insulating adhesive bond 12.

The first embodiment is disclosing the high frequency ceramic package which forms the external terminal by performing the brazing of the conductive leads 28 to the second conductive patterns 24b of the bottom surface of ceramic RF substrate 22.

As a result, as shown in FIG. 2 to FIG. 14, the high frequency ceramic package according to the first embodiment includes; the ceramic RF substrate 22; the first conductive patterns 24a placed on the top surface of the ceramic RF substrate 22; the second conductive patterns 24b placed on the bottom surface of the ceramic RF substrate 22; the through holes 25a for passing through the top surface and bottom surface of the ceramic RF substrate 22; the through hole metal layers 25 which are filled up in the through holes 25a and which connect the first conductive patterns 24a and the second conductive patterns 24b; the ceramic seal ring 14 placed on the ceramic RF substrate 22; the insulating adhesive bond 12 placed on the ceramic seal ring 14; and the ceramic cap 10 placed on the insulating adhesive bond 12.

(Fabrication Method of High Frequency Ceramic Package)

As shown in FIG. 2 to FIG. 14, a fabrication method of the high frequency ceramic package according to the first embodiment includes: the step of forming the ceramic RF substrate 22; the step of forming the first conductive patterns 24a on the top surface of the ceramic RF substrate 22; the step of forming the second conductive patterns 24b on the bottom surface of the ceramic RF substrate 22; the step of forming the through holes 25a for passing through the top surface and bottom surface of the ceramic RF substrate 22; the step of forming the through hole metal layers 25 which are filled up in the through holes 25a and which connects the first conductive patterns 24a and the second conductive patterns 24b; the step of forming the ceramic seal ring 14 on the ceramic RF substrate 22; the step of forming the insulating adhesive bond 12 on the ceramic seal ring 14; and the step of forming the ceramic cap 10 on the insulating adhesive bond 12. The fabrication method of the high frequency ceramic package according to the first embodiment further includes: the step of forming the conductive leads 28; and the step of performing the brazing of the conductive leads 28 and the second conductive patterns 24b.

Modified Example of the First Embodiment

The through hole metal layers 25 may be connected only with the first conductive patterns 24a, and may be directly connected with the conductive leads 28, without via the second conductive patterns 24b. In this case, the high frequency ceramic package according to the first embodiment includes: a ceramic RF substrate 22; first conductive patterns 24a placed on the top surface of the ceramic RF substrate 22; through holes 25a for passing through the top surface and bottom surface of the ceramic RF substrate 22; through hole metal layers 25 which is filled up in the through holes 25a and connected with the first conductive patterns 24a; a ceramic seal ring 14 placed on the ceramic RF substrate 22; an insulating adhesive bond 12 placed on the ceramic seal ring 14; and a ceramic cap 10 placed on the insulating adhesive bond 12. Between the ceramic cap 10 and the top surfaces of the ceramic seal ring 14 is sealed with the insulating adhesive bond 12. Moreover, the conductive leads 28 connected to the through hole metal layers 25 is provided. Since other configurations are the same as that of FIG. 2 to FIG. 14, the description is omitted.

A cross section configuration which connects the through hole metal layers 25 with the conductive leads 28 directly, without via the second conductive patterns 24b, is schematically expressed as FIG. 14B in a similar manner. In particular, it is a configuration, which can also apply the placing ceramic RF substrate 22 on a resin board.

(Fabrication Method of High Frequency Ceramic Package according to Modified Example)

A fabrication method of the high frequency ceramic package according to the modified example 1 of the first embodiment includes: the step of forming the ceramic RF substrate 22; the step of forming the first conductive patterns 24a on the top surface of the ceramic RF substrate 22; the step of forming the through holes 25a for passing through the top surface and bottom surface of the ceramic RF substrate 22; the step of forming the through hole metal layers 25 which are filled up in the through holes 25a and connected with the first conductive patterns 24a; the step of forming the ceramic seal ring 14 on the ceramic RF substrate 22; the step of forming the insulating adhesive bond 12 on the ceramic seal ring 14; and the step of forming the ceramic cap 10 on the insulating adhesive bond 12. The fabrication method further includes the step of forming the conductive leads 28, and the step of connecting the conductive leads 28 and the through hole metal layers 25.

Figure 15A:
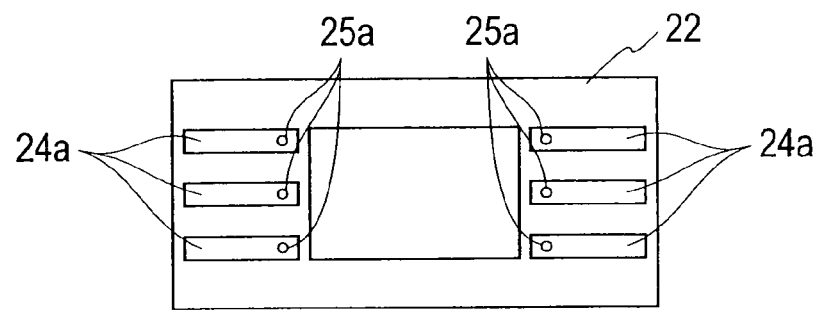
FIG. 15A is a configuration diagram of an alternative ceramic RF substrate applicable to the high frequency ceramic package according to the first embodiment of the present invention, and shows its top view.
Figure 15B:
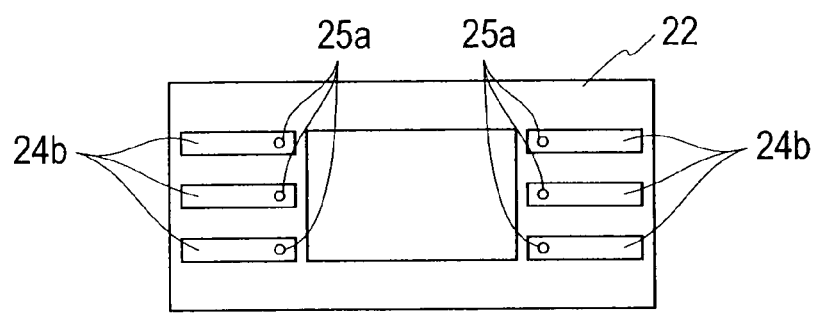
FIG. 15B is a configuration diagram of the alternative ceramic RF substrate applicable to the high frequency ceramic package according to the first embodiment of the present invention, and shows its bottom view.
Figure 15C:
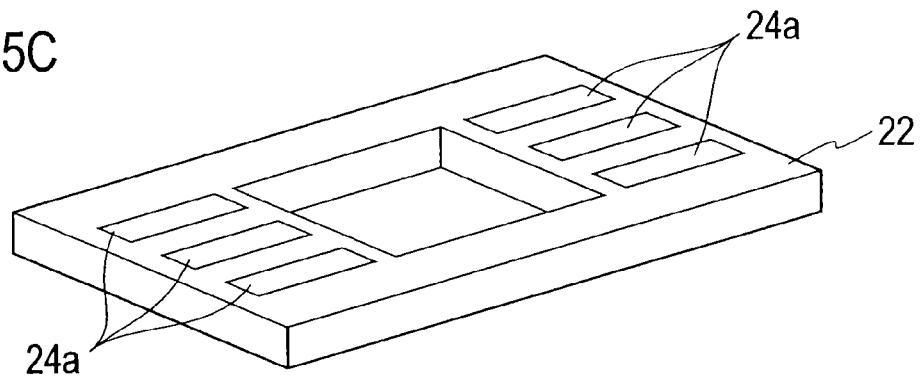
FIG. 15C is a configuration diagram of the alternative ceramic RF substrate applicable to the high frequency ceramic package according to the first embodiment of the present invention, and shows its bird's-eye view.

An alternative configuration of the ceramic RF substrate 22 of the high frequency ceramic package according to the first embodiment is expressed as shown in FIG. 15. The example shown in FIG. 15 is equivalent to the example by which the position of the through holes 25a is placed inside the ceramic seal ring 14.

Figure 16A:
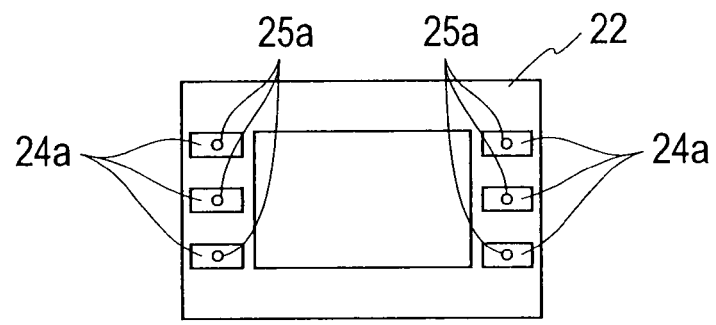
FIG. 16A is a configuration diagram of a further alternative ceramic RF substrate applicable to the high frequency ceramic package according to the first embodiment of the present invention, and shows its top view.
Figure 16B:
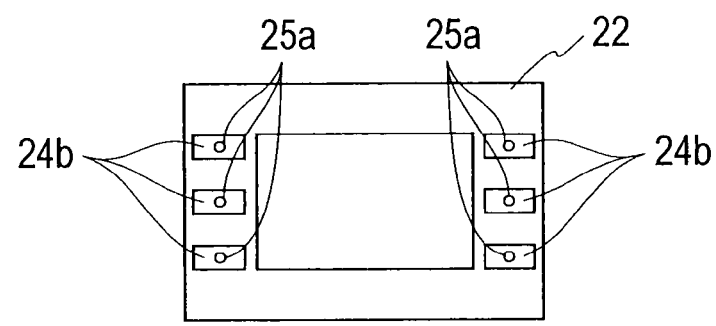
FIG. 16B is a configuration diagram of the further alternative ceramic RF substrate applicable to the high frequency ceramic package according to the first embodiment of the present invention, and shows its bottom view.
Figure 16C:
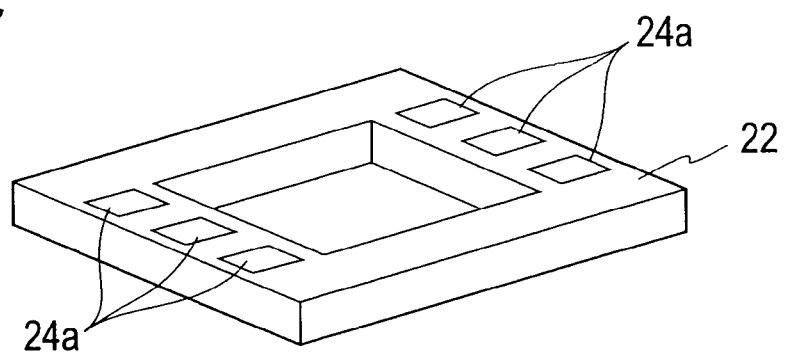
FIG. 16C is a configuration diagram of the further alternative ceramic RF substrate applicable to the high frequency ceramic package according to the first embodiment of the present invention, and shows its bird's-eye view.

Another alternative configuration of the ceramic RF substrate 22 of the high frequency ceramic package according to the first embodiment is expressed as shown in FIG. 16. The example shown in FIG. 16 is equivalent to the example by which the position of the through holes 25a is placed at the lower part of the ceramic seal ring 14. Although the position of the through holes 25a is placed also at the lower part of the ceramic seal ring 14 in the first embodiment, it is equivalent to the example by which the ceramic RF substrate 22 is further miniaturized, in the example shown in FIG. 16.

Figure 17A:
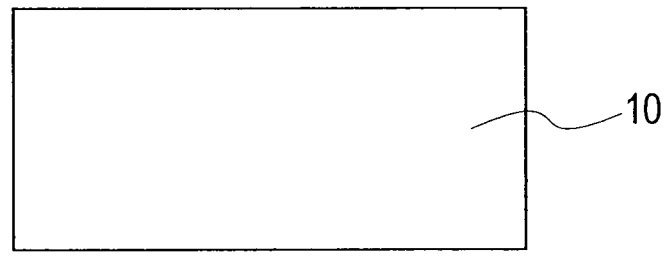
FIG. 17A is a configuration diagram of an alternative ceramic cap applicable to the high frequency ceramic package according to the first embodiment of the present invention, and shows its top view.
Figure 17B:
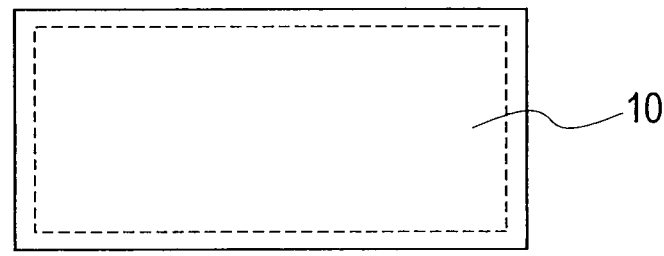
FIG. 17B is a configuration diagram of the alternative ceramic cap applicable to the high frequency ceramic package according to the first embodiment of the present invention, and shows its bottom view.
Figure 17C:
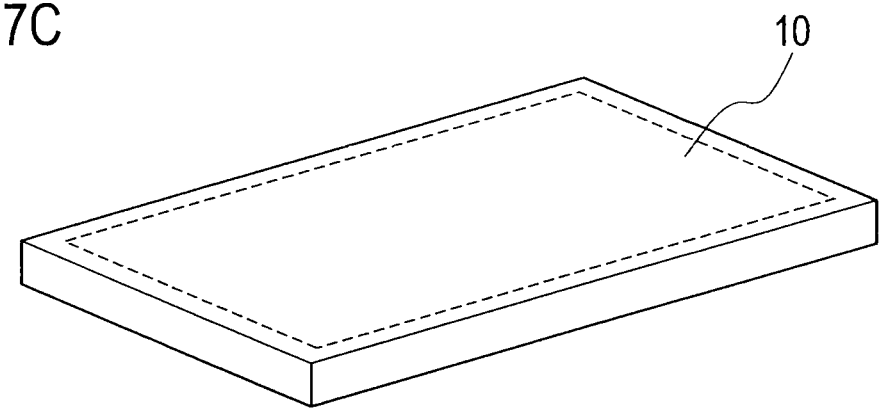
FIG. 17C is a configuration diagram of the alternative ceramic cap applicable to the high frequency ceramic package according to the first embodiment of the present invention, and shows its bird's-eye view.

An alternative configuration of the ceramic cap 10 of the high frequency ceramic package according to the first embodiment is expressed as shown in FIG. 17. The example shown in FIG. 17 shows the example for which the ceramic cap 10 has a cavity portion by boxy shape.

Figure 18A:
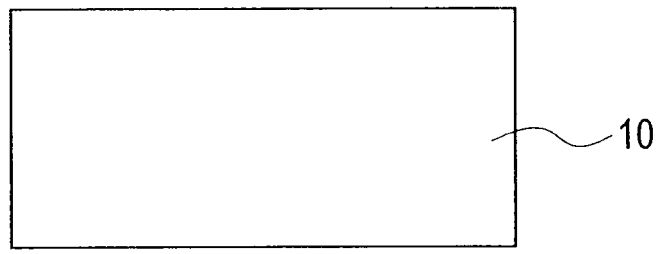
FIG. 18A is a configuration diagram of a further alternative ceramic cap applicable to the high frequency ceramic package according to the first embodiment of the present invention, and shows its top view.
Figure 18B:
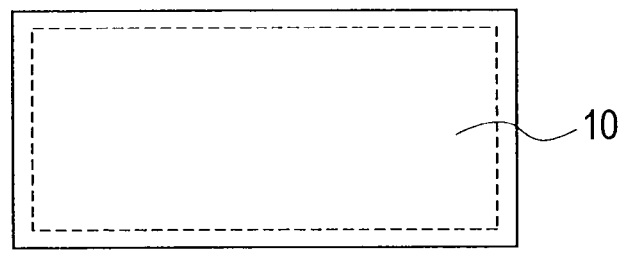
FIG. 18B is a configuration diagram of the further alternative ceramic cap applicable to the high frequency ceramic package according to the first embodiment of the present invention, and shows its bottom view.
Figure 18C:
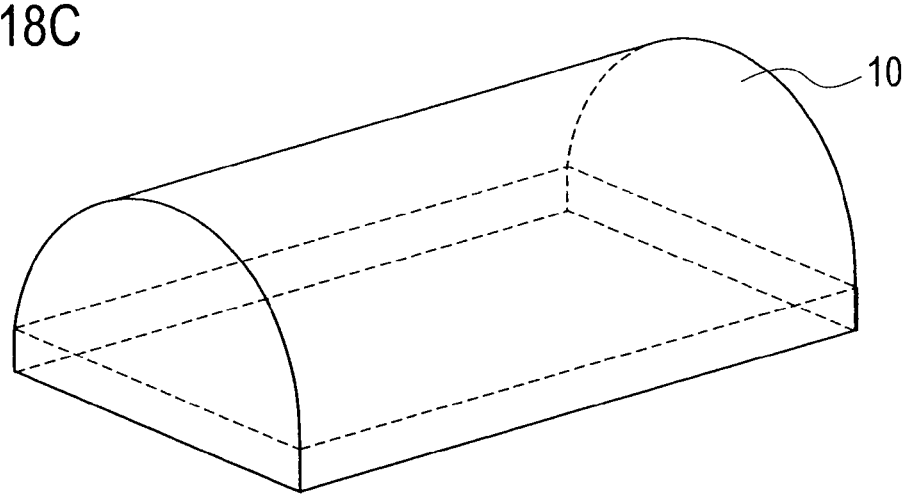
FIG. 18C is a configuration diagram of the further alternative ceramic cap applicable to the high frequency ceramic package according to the first embodiment of the present invention, and shows its bird's-eye view.

Another alternative configuration of the ceramic cap 10 of the high frequency ceramic package according to the first embodiment is expressed as shown in FIG. 18. The example shown in FIG. 18 shows the example for which the ceramic cap 10 has a cavity portion of wagon-head shape.

The high frequency ceramic package according to the first embodiment has the high frequency characteristics of not less than 20 GHz. For this reason, it is applicable as a device and a package for component parts of high frequency (i.e., beyond 20 GHz).

According to the first embodiment of the present invention, a high frequency ceramic package, which the structure is easy, and the fabrication method is easy for, and is excellent in high frequency characteristics, and a fabrication method for the high frequency ceramic package can be provided.

According to the first embodiment of the present invention, by providing the external terminal in the bottom surface of the ceramic RF substrate, the external terminal can be formed on the same plane of the bottom surface of the package, and then a high frequency ceramic package in which the surface mount by a reflow is possible, and a fabrication method for the high frequency ceramic package can be provided.

According to the first embodiment of the present invention, by providing the external terminal in the bottom surface of the ceramic RF substrate, a high frequency ceramic package in which the impedance mismatching between the external terminal and the conductive pattern on the package mounting substrate is reduced, and the improvement effect of RF characteristics appears remarkably in particular in high frequency, such as a millimeter wave, and a fabrication method for the high frequency ceramic package can be provided.

Other Embodiments

While the present invention is described in accordance with the aforementioned first embodiment and modified example of the first embodiment, it should not be understood that the description and drawings that configure part of this disclosure are to limit the present invention. This disclosure makes clear a variety of alternative embodiments, working examples, and operational techniques for those skilled in the art.

In addition, it cannot be overemphasized that the semiconductor devices mounted on the high frequency ceramic package according to the embodiment of the present invention are applicable not only to FETs (Field Effect Transistors) but also other amplifying elements, such as LDMOS (Lateral Doped Metal-Oxide-Semiconductor) FETS, HEMTs (High Electron Mobility Transistors), HBTs (Hetero-junction Bipolar Transistors), and MEMS (Micro Electro Mechanical Systems) devices.

Such being the case, the present invention covers a variety of embodiments, whether described or not.

INDUSTRIAL APPLICABILITY

A high frequency ceramic package according to the present invention has a wide range of application fields, such as an internally matched power amplifier, a power MMIC (Monolithic Microwave Integrated Circuit), a microwave power amplifier, a millimeter wave power amplifier, and a high frequency MEMS device.

REFERENCE SIGNS LIST

10: Ceramic cap;
12 and 16: Insulating adhesive bond;
14: Ceramic seal ring;
18: Semiconductor chip;
20: Bonding wire;
22: Ceramic RF substrate;
24a: First conductive pattern;
24b: Second conductive pattern;
25: Through hole metal layer;
25a: Through hole;
26: Insulating or conductive adhesive bond;
28: Conductive lead;
30: Conductive base plate;
32: Brazing portion; and
34: Cavity portion.

The invention claimed is:

1. A high frequency ceramic package comprising:
a conductive base plate;
a ceramic RF substrate placed on the conductive base plate;
a first conductive pattern placed on the top surface of the ceramic RF substrate;
a plurality of second conductive patterns placed on the bottom surface of the ceramic RF substrate;
a plurality of through holes for passing through the top surface and bottom surface of the ceramic RF substrate;
a plurality of through hole metal layers filled in the plurality of through holes and which connect the first conductive pattern and the plurality of second conductive patterns;
a ceramic seal ring placed on the ceramic RF substrate;
an insulating adhesive bond placed on the ceramic seal ring;
a ceramic cap placed on the insulating adhesive bond; and
a plurality of conductive leads connected with the plurality of second conductive patterns, the plurality of conductive leads and the conductive base plate being placed in the same plane and separated from each other, wherein
the plurality of second conductive patterns is used as external terminals, and between the ceramic cap and the top surfaces of the ceramic seal ring is sealed with the insulating adhesive bond.

2. The high frequency ceramic package according to claim 1 further comprising:
a brazing portion for connecting the plurality of conductive leads and the plurality of second conductive patterns.

3. The high frequency ceramic package according to claim 1, wherein
the ceramic RF substrate is placed on the conductive base plate via one of an insulating adhesive bond and a conductive adhesive bond.

4. The high frequency ceramic package according to claim 1 further comprising:
a cavity portion formed in the ceramic RF substrate; and
a semiconductor chip placed in the cavity portion.

5. The high frequency ceramic package according to claim 4, wherein
the semiconductor chip is connected with the first conductive pattern through a bonding wire.

6. The high frequency ceramic package according to claim 1, wherein
the ceramic cap has one of flat plate shape, boxy shape, and wagon-head shape.

7. The high frequency ceramic package according to claim 1, wherein
the ceramic RF substrate is placed on a resin board.

8. A high frequency ceramic package comprising:
a conductive base plate;
a ceramic RF substrate placed on the conductive base plate;
a first conductive pattern placed on the top surface of the ceramic RF substrate;
a plurality of through holes for passing through the top surface and bottom surface of the ceramic RF substrate;
a plurality of through hole metal layers filled in the plurality of through holes and connected with the first conductive pattern;

a ceramic seal ring placed on the ceramic RF substrate;
an insulating adhesive bond placed on the ceramic seal ring;
a ceramic cap placed on the insulating adhesive bond;
a plurality of conductive leads connected with the plurality of through holes, the plurality of conductive leads and the conductive base plate being placed in the same plane and separated from each other, wherein
between the ceramic cap and the top surfaces of the ceramic seal ring is sealed with the insulating adhesive bond.

9. The high frequency ceramic package according to claim 8, wherein
the ceramic RF substrate is placed on the conductive base plate via one of an insulating adhesive bond and a conductive adhesive bond.

10. The high frequency ceramic package according to claim 8 further comprising:
a cavity portion formed in the ceramic RF substrate; and
a semiconductor chip placed in the cavity portion.

11. The high frequency ceramic package according to claim 10, wherein
the semiconductor chip is connected with the first conductive pattern via a bonding wire.

12. The high frequency ceramic package according to claim 8, wherein
the ceramic cap has one of flat plate shape, boxy shape, and wagon-head shape.

13. The high frequency ceramic package according to claim 8, wherein
the ceramic RF substrate is placed on a resin board.

14. A fabrication method for a high frequency ceramic package comprising:
forming a ceramic RF substrate;
forming a first conductive pattern on the top surface of the ceramic RF substrate;
forming a plurality of second conductive patterns on the bottom surface of the ceramic RF substrate;
forming a plurality of through holes for passing through the top surface and bottom surface of the ceramic RF substrate;
forming a plurality of through hole metal layers filled in the plurality of through holes and connect the first conductive pattern and the plurality of second conductive pattern;
forming a ceramic seal ring on the ceramic RF substrate;
forming an insulating adhesive bond on the ceramic seal ring;
forming a ceramic cap on the insulating adhesive bond;
installing the ceramic RF substrate on a conductive base plate;
forming a plurality of conductive leads in the same plane as the conductive base plate, the plurality of conductive leads and the conductive base plate being separated from each other; and
connecting the plurality of conductive leads with the plurality of second conductive patterns.

15. The fabrication method for the high frequency ceramic package according to claim 14, wherein
the plurality of conductive leads and the plurality of second conductive patterns are brazed.

16. A fabrication method for a high frequency ceramic package comprising:
forming a ceramic RF substrate;
forming a first conductive pattern on the top surface of the ceramic RF substrate;
forming a plurality of through holes for passing through the top surface and bottom surface of the ceramic RF substrate;
forming a plurality of through hole metal layers filled in the plurality of through holes and connected with the first conductive pattern;
forming a ceramic seal ring on the ceramic RF substrate;
forming an insulating adhesive bond on the ceramic seal ring;
forming a ceramic cap on the insulating adhesive bond;
installing the ceramic RF substrate on a conductive base plate; and
forming a plurality of conductive leads in the same plane as the conductive base plate, the plurality of conductive leads and the conductive base plate being separated from each other; and
connecting the plurality of conductive leads with the plurality of through holes.

* * * * *